(12) United States Patent
Liu

(10) Patent No.: US 8,728,932 B2
(45) Date of Patent: May 20, 2014

(54) CONTACT FOR MEMORY CELL

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 13/734,476

(22) Filed: Jan. 4, 2013

(65) Prior Publication Data

US 2013/0149861 A1 Jun. 13, 2013

Related U.S. Application Data

(62) Division of application No. 12/622,121, filed on Nov. 19, 2009, now Pat. No. 8,361,832, which is a division of application No. 11/396,622, filed on Apr. 4, 2006, now abandoned.

(51) Int. Cl.
*H01L 21/4763* (2006.01)

(52) U.S. Cl.
USPC ........... 438/634; 438/631; 438/645; 438/696; 257/E45.002

(58) Field of Classification Search
USPC .................. 438/95, 102, 626, 631, 634, 645, 438/694–697; 257/E45.002
See application file for complete search history.

(56) References Cited

U.S. PATENT DOCUMENTS 6,670,628 B2 12/2003 Lee et al.
6,841,853 B2 1/2005 Yamada
2003/0071255 A1 4/2003 Xu
2006/0125108 A1 6/2006 Gutsche et al.
2010/0001253 A1* 1/2010 Arnold et al. ............. 257/4
2011/0163288 A1* 7/2011 Lung ...................... 257/3

OTHER PUBLICATIONS

Hudgens, S. et al., "Overview of Phase-Change Chalcogenide Nonvolatile Memory Technology", MRS Bulletin, Nov. 2004, pp. 829-832, www.mrs.org/publications/bulletin.
Lee, S.H. et al., "Full Integration and Cell Characteristics for 64Mb Nonvolatile PRAM", 2004 Symposium on VLSI Technology Digest of Technical Papers, pp. 20-21.
Hwang, Y.N. et al., "Full Integration and Reliability Evaluation of Phase-Change RAM Based on 0.24μm—CMOS Technologies", 2003 Symposium on VLSI Technology Digest of Technical Papers, pp. 173-174.
Ahn, S.J. et al., "Highly Reliable 50nm Contact Cell Technology for 256Mb PRAM", 2005 Symposium on VLSI Technology Digest of Technical Papers, pp. 98-99.
Ielmini, Daniele et al., "Analysis of Phase Distribution in Phase-Change Nonvolatile Memories", IEEE Electron Device Letters, pp. 507-509, vol. 25, No. 7, Jul. 2004.
Hwang, Y.N. et al., "Writing Current Reduction for High-density Phase-change RAM", 2003 IEEE.
Lai, Stefan et al., "OUM—A 180 nm Nonvolatile Memory Cell Element Technology for Stand Alone and Embedded Applications", 2001 IEEE.

(Continued)

*Primary Examiner* — Matthew E Warren
(74) *Attorney, Agent, or Firm* — Dickstein Shapiro LLP

(57) ABSTRACT

A contact for memory cells and integrated circuits having a conductive layer supported by the sidewall of a dielectric mesa, memory cells incorporating such a contact, and methods of forming such structures.

11 Claims, 6 Drawing Sheets

(56) References Cited

OTHER PUBLICATIONS

Pirovano, Agostino et al., "Reliability Study of Phase-Change Nonvolatile Memories", IEEE Transactions on Device and Materials Reliability, vol. 4, No. 3, Sep. 2004, pp. 422-427.

Varesi, E. et al., "Advances in Phase Change Memory Technology".

Bedeschi, F. et al., "An 8Mb Demonstrator for High-Density 1.8V Phase-Change Memories", 2004 Symposium on VLSI Circuits Digest of Technical Papers, pp. 442-445.

Redaelli, A. et al., "Comprehensive Numerical Model for Phase-Change Memory Simulations", pp. 279-282.

Maimon, J. et al., "Demonstration of Chalcogenide Based Non Volatile Memory".

Ha, Y.H. et al., "An Edge Contact Type Cell for Phase Change RAM Featuring Very Low Power Consumption", 2003 Symposium on VLSI Technology Digest of Technical Papers, pp. 175-176.

Hutchby, James et al., "Emerging Research Memory and Logic Technologies", IEEE Circuits & Devices Magazine, May/Jun. 2005, pp. 47-51.

Kim, Sung et al., "Simulation for Reset Operation of $Ge_2Sb_2Te_5$ Phase-Change Random Access Memory", Japanese Journal of Applied Physics, vol. 44, No. 8, 2005, pp. 5943-5948.

\* cited by examiner

CONTACT FOR MEMORY CELL

CROSS-REFERENCE TO RELATED APPLICATIONS

The present application is a divisional application of U.S. application Ser. No. 12/622,121, filed Nov. 19, 2009, which is a divisional application of U.S. application Ser. No. 11/396,622, filed Apr. 4, 2006 (now abandoned), each of which is incorporated by reference herein in its entirety.

FIELD OF THE INVENTION

The invention relates to semiconductor devices. In particular, the invention relates to contacts for memory devices.

BACKGROUND OF THE INVENTION

Non-volatile memories are a desirable evolution in integrated circuit design due to their ability to maintain data absent a power supply. Phase-change materials, as well as other resistance variable materials, have been investigated for use in non-volatile memory cells. Phase-change memory cells include phase-change materials, such as chalcogenide alloys, which are capable of stably transitioning between amorphous and crystalline phases. Each phase exhibits a particular resistance state and the resistance states distinguish the logic values of the memory cell. For example, a memory element in an amorphous state exhibits a relatively high resistance and a memory element in a crystalline state exhibits a relatively low resistance, each of which can be sensed as stored data.

A typical phase-change memory cell has a layer of phase-change material between first and second electrodes. As an example, the phase-change material can be a chalcogenide alloy, such as $Ge_2Sb_2Te_5$ or AgInSbTe. When used in a memory device, a portion of the phase-change material is set to a particular resistance state according to the amount of current applied via the electrodes. To obtain an amorphous state, a relatively high write current pulse (a reset pulse) is applied through the phase-change cell to melt a portion of the material for a first period of time. The current is removed and the cell cools rapidly to a temperature below its crystallization temperature, which results in a portion of the material having an amorphous phase. To obtain a crystalline state, a lower current write pulse (a set pulse) is applied to the phase-change cell for a second period of time (typically longer in duration than the first period of time) to heat the material to a temperature below its melting point, but above its crystallization temperature. This causes the amorphous portion of the material to re-crystallize to a crystalline phase that is maintained once the current is removed and the cell is cooled.

The typically large programming current of phase-change memory devices is a limiting factor in reducing the memory cell size. The programmable volume of phase-change memory cell and programming current requirement are dependent on the area of the bottom electrode in contact with the memory element of the cell. To reduce such current, it is desirable to reduce the effective bottom electrode area in contact with the cell.

One issue effecting resistance-based memory, such as phase change memory, functionality is the non-uniformity of bottom electrode area. Non-uniformity in bottom electrode size across a memory array leads to non-uniformity of programming current requirement for different memory cells of the array, which makes it difficult to design a circuit that can accommodate the variation between bits. Undesired variation in bottom electrode size causes set and reset resistance distribution overlap, which, in the worst case, makes establishing a sensing scheme for all bits of an array impossible. Reduction in bottom electrode size should be combined with electrode size uniformity to achieve an ideal contact for a resistance memory device.

One technique used to reduce bottom electrode size has been to employ anisotropically etched spacers in a via to make contacts smaller than the photolithographic limit. This technique gives rise to large variations in contact size since variations in chemical mechanical polishing (CMP) and via edge rounding cause the contacts to have different heights and cross-sections and thus different contact areas with respect to an overlying memory element.

Another technique used to reduce bottom electrode size has been to use ring shaped contacts. FIGS. 1a-1d show two such ring shaped contacts 20 formed over the same substrate simultaneously, but having different dimensions due to processing variances. FIG. 1c shows the contact 20 shown in cross section a-a' of FIG. 1a from above. FIG. 1d shows the contact 20 shown in cross section b-b' of FIG. 1b from above. Such contacts 20 have been formed simultaneously by etching a via 14 into a dielectric layer 12 to expose a conductive layer 10 (which can be over a substrate 1). A conductive liner 16 is deposited conformally within the via 14, along its bottom, over the conductive layer 10, and along the via's sidewalls. Another dielectric material 18, such as silicon oxide, is deposited over the conductive liner 16 and within the via 14. A CMP step removes both the conductive liner 14 and dielectric material 18, stopping in the dielectric layer 12, so that an exposed ring of conductive liner 16 remains as a contact 20 as shown in FIGS. 1c and 1d.

As shown in the side-by-side comparisons of the contact 20 of FIGS. 1a and 1c and the contact 20 of FIGS. 1b and 1d, ring shaped contacts 20 formed simultaneously over the same substrate 10 can have different cross sectional areas even when the conductive liner 16 is the same thickness in both vias 14 due to process variations in CMP height in combination with via 14 sidewall slope variation and rounding of via 14 edges.

There have been attempts to resolve the problems of the prior art relating to the rounded edge of via and CMP height variations. For example, a two-step CMP process, as shown in FIGS. 2a-2d, has been proposed where a layer of silicon oxide 12b is formed over a layer of silicon oxynitride 12a and the contact via 14a is formed through both to an underlying conductive layer 10a. FIG. 2c shows the contact 20a shown in cross section c-c' of FIG. 2a from above. FIG. 2d shows the contact 20a shown in cross section d-d' of FIG. 2b from above. After forming the conformal conductive liner 16b in the via 14a, with a conformal silicon nitride layer 16a thereunder, and a silicon oxide plug 18a over each, a first CMP step is used to remove the conformal conductive liner 16b, the silicon oxide plug 18a, and part of the silicon oxide layer 12a, stopping part-way through the silicon oxide layer 12b. An etch-back step removes the silicon oxide layer 12b and exposes the silicon oxynitride layer 12a. A second CMP step flattens the contacts 20a to a uniform height.

The above proposed process does potentially resolve CMP height variation and via edge rounding issues. However, due to via 14a slope variation, the contacts 20a formed simultaneously by such a technique will still tend to vary in size and shape, as shown by the comparison between the contact 20a shown in FIGS. 2a and 2c and the contact shown in FIGS. 2b and 2d, which leads to the same programming problems as the other techniques discussed above.

It is desirable to mitigate processing variability and provide more consistently shaped contacts for electrodes.

DETAILED DESCRIPTION

The invention relates to electrodes for memory cells. The electrodes are formed, in part, by chemical mechanical polishing techniques and also, in part, by selective etching techniques to provide support mesas for ring shaped conductive layers. The electrodes formed in accordance with the invention have more consistently sized surface areas across an array of memory cells. Using dielectric mesas as a support structure for the electrodes allows surface area variation due to CMP height and via size and curvature to be mitigated. These and other features of the invention will be better understood from the following detailed description, which is provided in connection with the accompanying drawings.

Although this invention will be described in terms of certain exemplary embodiments, other embodiments will be apparent to those of ordinary skill in the art, which also are within the scope of this invention. Accordingly, the scope of the invention is defined only by reference to the appended claims.

The term "substrate" in the following description refers to any supporting layer suitable for fabricating an integrated circuit, typically semiconductor based, but not necessarily so. A substrate may be silicon-based, may include epitaxial layers of silicon supported by a base semiconductor foundation, can be sapphire-based, silicon-on-insulator (SOI), metal, polymer, or any other materials suitable for supporting an integrated circuit. When reference is made to a substrate or wafer in the following description, previous process steps may have been utilized to form regions or junctions in or over a base semiconductor or foundation.

Although this invention will be described primarily in relation to phase-change memories, the invention is not limited to such uses. The contacts and methods of forming contacts described herein are suitable for use in any integrated circuit and would be advantageous wherever a reduction of size or increased uniformity in electrodes would be desirable, particularly in memory cells. Although the invention is described in relation to a single memory cell and the forming thereof, it can be utilized in an array of such memory cells, which can be formed simultaneously, or in parts of an integrated circuit not used for memory.

Figure 9:
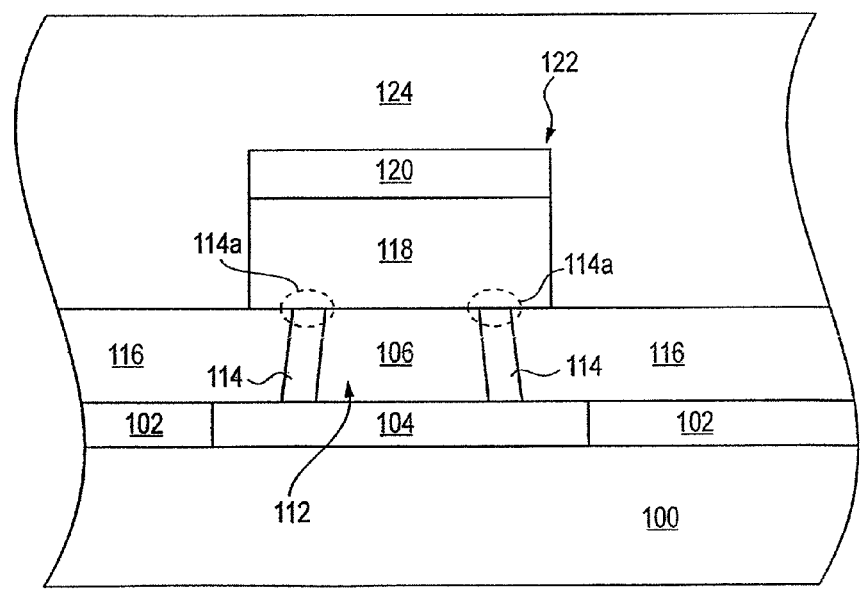

The invention will now be explained with reference to the accompanying figures wherein like reference numbers are used consistently for like features throughout the drawings. FIG. 9 shows a completed memory cell 122, which is typically one of many like cells of a memory array, supported by a substrate 100. The memory cell 122 is preferably a phase-change memory having a memory element 118 made of a material that changes between an amorphous and crystalline state in response to applied current. The memory cell 122 can also be other memory types as well, such as a non-phase change variable resistance chalcogenide-based memory or other variable resistance memories. In the preferred phase-change memory cell 122, the memory element 118 includes a chalcogenide alloy, such as $Ge_xSb_yTe_z$ (where x is about 2, y is about 2, and z is about 5) or AgInSbTe. Other phase-change materials can be used also.

The memory cell 122 also includes a bottom electrode layer 114, which is preferably shaped like a ring, but not necessarily so, supported by a dielectric material mesa 112. The mesa 112 structure is preferably substantially circular shaped in top view such that it has a single, continuous sidewall; however, this is not necessarily so and the mesa 112 can be other shapes as well, e.g., rectangular. The bottom electrode layer 114 is preferably titanium nitride (TiN), but can also be other conductive materials that can be selectively removed from horizontally planar surfaces by etching, such as titanium aluminum nitride (TiAlN) or tantalum nitride (TaN), for example. The bottom electrode layer 114 is configured so that it has a surface area 114a in contact with the memory element 118 of the memory cell 122. The surface area 114a of the bottom electrode layer 114 is determined by the thickness of the layer 114, which is preferably about 100 Å, and the interior radius "r" of the electrode ring (FIG. 8), based on the formula $\pi(r+t)^2 - \pi r^2$ (t being the layer 114 thickness), if the electrode 114 is ring shaped. In accordance with the invention, the surface area 114a of the bottom electrode layer 114 in contact with the memory element 118 is consistent throughout the similar memory cells (e.g., 122) of a memory array, formed in the same processing sequence.

Figure 8:
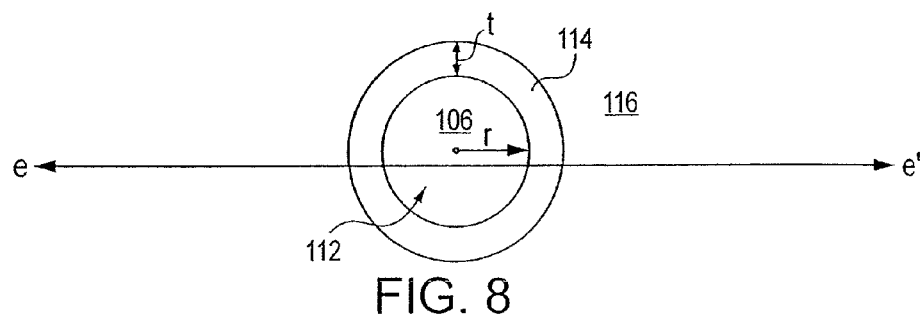

The ring-shaped bottom electrode layer 114 has a surface area 114a consistent with respective surface areas of other bottom electrode layers of a memory array formed during the same processing acts because CMP variations during processing are mitigated and CMP height is controlled, and the overall surface area 114a depends primarily on the thickness of the bottom electrode layer 114, not on any via formation shape (FIGS. 1a-2d). Mesa 112 size (as characterized by r; FIG. 8) is consistent across the array because it is determined by standard photolithographic techniques. This consistency in electrode surface area 114a mitigates undesirable inconsistency in set and reset resistance distributions in the operation of the memory cell 122, as compared to conventional phase-change memory devices.

The memory cell 122 shown in FIG. 9 also has a top electrode layer 120, which can be any conductive material known in the art as suitable for an electrode, such as titanium nitride, for example. The bottom electrode layer 114 is over a conductive region 104, which can be a conductive interconnect line or a plug to an active area of the substrate 100, for example. The conductive region 104 is in electrical communication with a voltage source for generating the current required to operate the memory cell 122.

The memory element 118 and top electrode layer 120 provided over the bottom electrode layer 114 and mesa 112 can be electrically isolated from other memory cells of an array, as well as from other parts of the same integrated circuit, by another dielectric layer 124. This dielectric layer 124 can be any insulating material, such as an oxide, nitride or BPSG, for example.

Figure 1A:
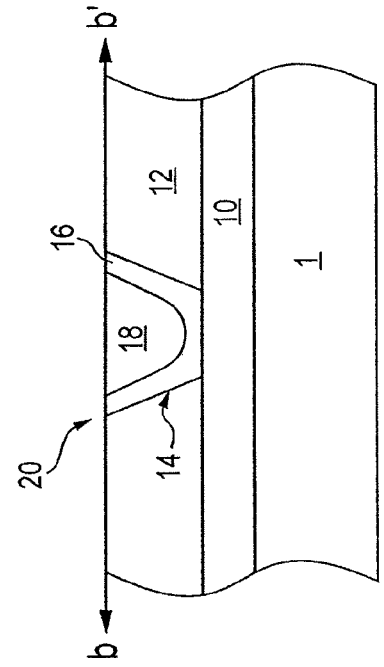
FIGS. 1a-1d show a contact of the prior art.
Figure 1C:
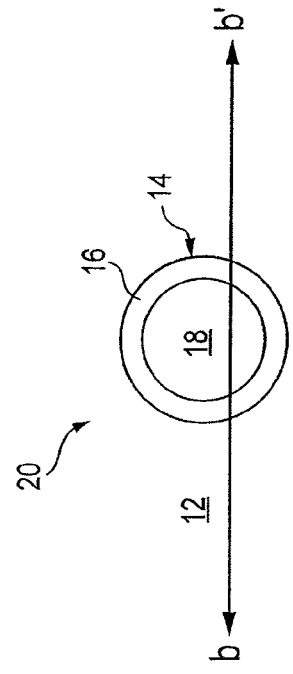
Figure 1B:
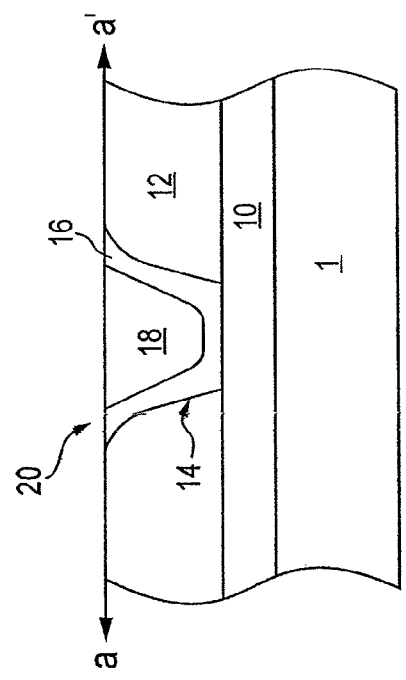
Figure 1D:
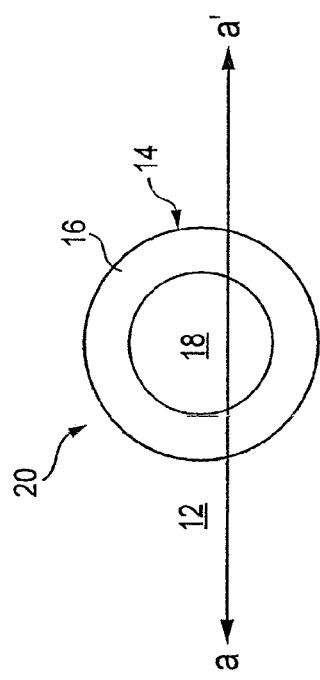
Figure 2C:
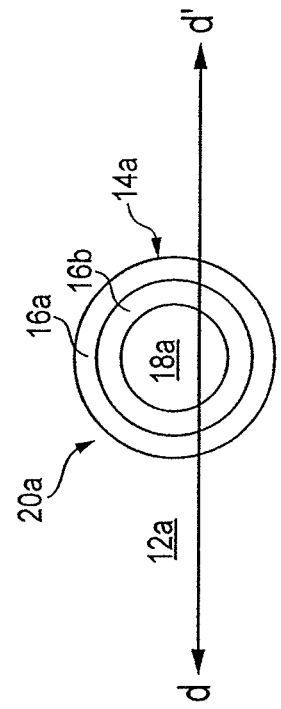
FIGS. 2a-2d show a contact of the prior art.
Figure 2D:
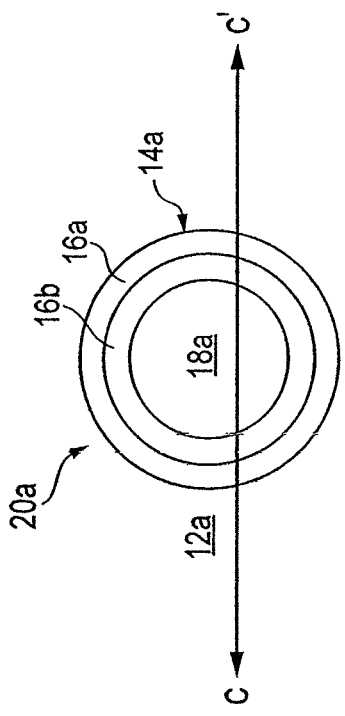
Figure 2A:
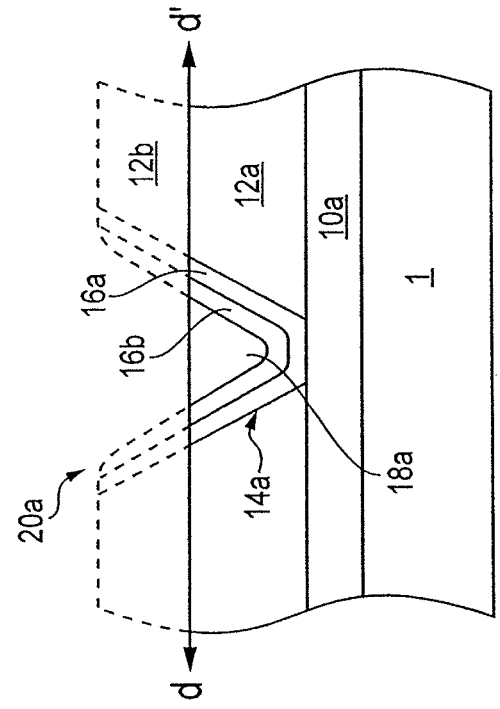
Figure 2B:
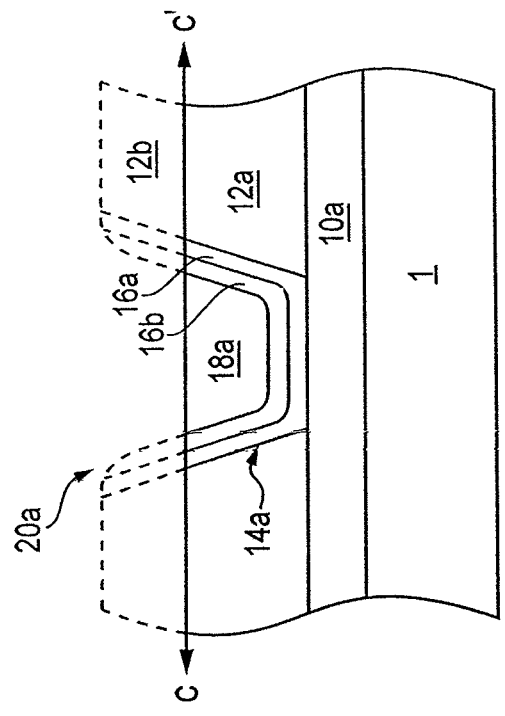
Figure 3:
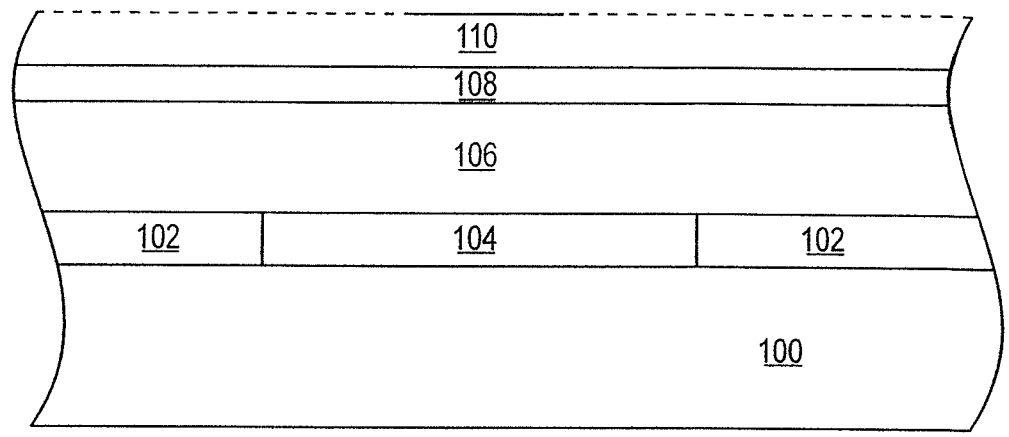
FIGS. 3-9 show a portion of a wafer during the fabrication of a memory cell in accordance with the invention.

A sequence of processing steps for forming a ring-shaped electrode 114 and memory cell 122 as shown in FIG. 9 is shown in FIGS. 3-8. FIG. 3 shows a substrate 100, which can be semiconductor based or other materials suitable to support an integrated circuit. A layer of dielectric material 102 is formed over the substrate 100. The dielectric material can be silicon oxide or another insulating material. A via is formed in the dielectric layer 102 and a conductive layer 104 is formed over the dielectric layer 102 and the exposed substrate 100. The conductive layer 104 can be polysilicon, metal, metal alloy, or other materials suitable for use as a conductive line or plug. The conductive layer 104 and dielectric layer 102 are planarized, for example, by CMP, using the dielectric layer 102 as a stop. The conductive layer 104 can be a plug to contact an underlying active region of the substrate 100 or can be an electrical interconnect line of an integrated circuit.

Figure 4:
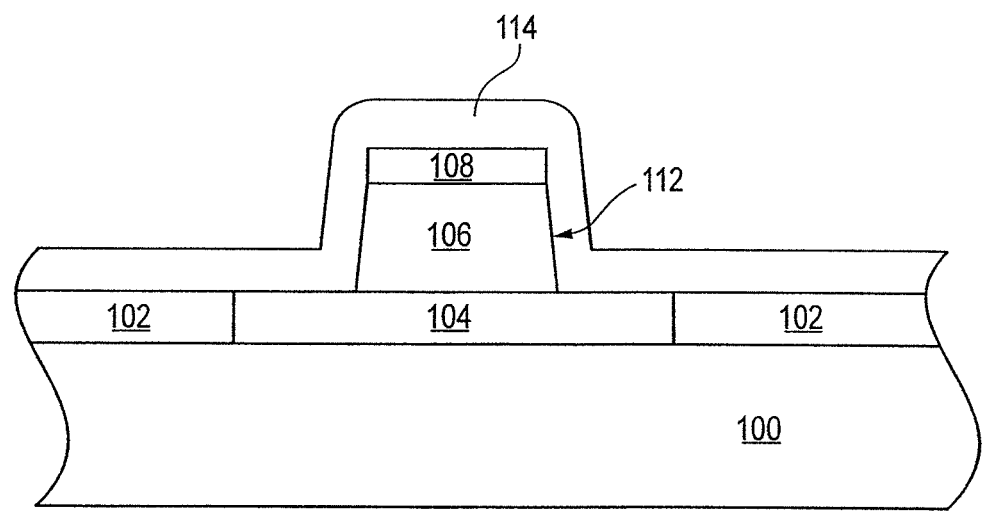

Another dielectric layer 106 is formed over the conductive layer 104 and dielectric layer 102. This dielectric layer 106 can be many materials, as discussed above in relation to FIG. 9, but should be a material which can be removed or retained selectively with respect to other dielectric materials, for instance in a stop-on-nitride (SON) CMP procedure. For example, the dielectric layer 106 is preferably silicon nitride ($Si_xN_y$) and is formed to be about 1,000 Å thick. Other suitable materials for layer 106 include oxides (if a stop on oxide CMP is used in later processing), such as tantalum oxide, aluminum oxide, titanium dioxide, magnesium oxide. Layer 106 may also include silicon carbide, zirconia, and strontium titante, for examples. This layer 106 will be formed into mesas 112 in later processing (FIG. 4).

A layer of hard mask material 108 is formed over the dielectric layer 106. If the dielectric layer 106 is silicon nitride, the hard mask layer 108 is preferably silicon oxide so that the dielectric layer 106 can be selectively etched relative to the hard mask 108 and also so the hard mask 108 can be selectively removed by CMP relative to the dielectric layer 106. Silicon oxide and silicon nitride are materials having such characteristics for this selectivity. It is also possible to use these materials in the reverse order, i.e., an oxide for the dielectric layer 106 and a nitride for the hard mask 108. Other such combinations of materials are also possible, so long as the selective etch and selective CMP can be used.

A layer of photoresist 110 is formed over the hard mask layer 108. The photoresist layer 110 is patterned (see solid portion), for example, by known photolithographic techniques, to leave a mask to define the area where a mesa 112 is to be formed (FIG. 4). A dry etch step transfers the pattern into the hard mask layer 108 and the photoresist 110 is stripped. Another etching step removes the dielectric layer 106 that is not protected by the hard mask layer 108, stopping at the conductive layer 104 and dielectric layer 102. This will leave a mesa 112 with the hard mask layer 108 there over, as shown in FIG. 4. The mesa 112 can be any shape, with round or substantially round in top view being preferred.

A layer of conductive material 114 is formed over the mesa 112, conductive layer 104, and dielectric layer 102. This layer 114 will eventually become the bottom electrode layer 114 shown in FIG. 9. Titanium nitride is preferred for layer 114 and it is preferably about 100 Å thick. The conductive layer 114 can be other materials also, for example, titanium aluminum nitride (TiAlN) or tantalum nitride (TaN). The conductive material of layer 114 can be different and the thickness varied to suit performance demands.

Figure 5:
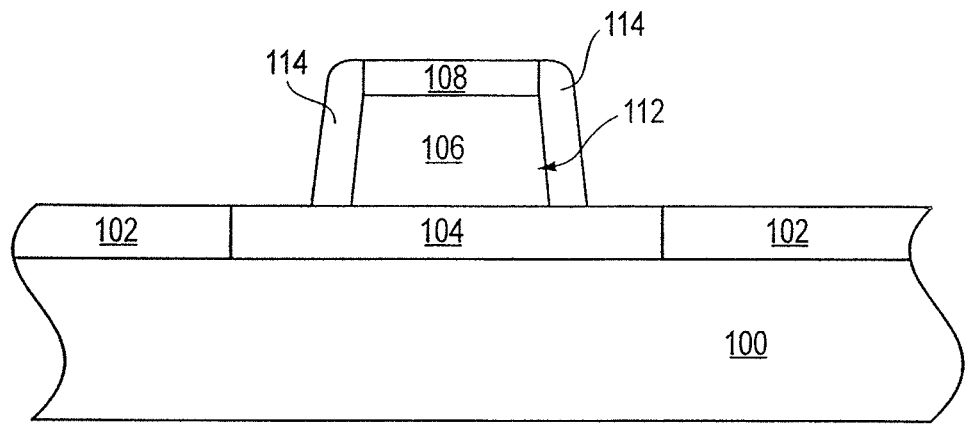

Now referring to FIG. 5, a dry etch removes the conductive material of layer 114 from horizontal surfaces of the wafer. The conductive material of layer 114 is removed from over the dielectric layer 102, from over a portion of the conductive layer 104, and from over the hard mask layer 108. The conductive layer 114 is left on the sides of the mesa 112 so as to become a ring shaped bottom electrode (FIG. 8). The dry etch can be a $CF_4$, $Cl_2$ or $Cl_2/CF_4$ plasma etch, for example.

Figure 6:
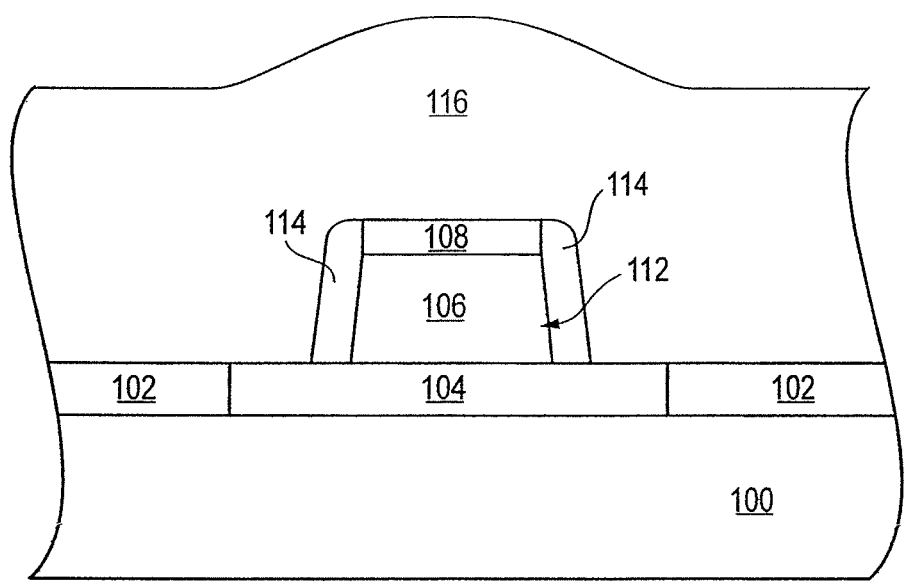

FIG. 6 shows that another dielectric layer 116 is formed over the mesa 112, the bottom electrode layer 114, and hard mask layer 108. When the mesa 112 is a nitride and the hard mask layer 108 is an oxide, the dielectric layer 116 should be an oxide. The dielectric layer 116 should have CMP selectivity characteristics similar to the hard mask layer 108, regardless of the specific materials used for any layers. The dielectric layer 116 can be deposited by high density plasma (HDP), which is a chemical vapor deposition (CVD) process, so as to provide a good gap fill. Other CVD processes can be used as well, such as PECVD (plasma enhanced), LPCVD (low pressure), and ALD (atomic layer deposition). The dielectric layer 116 is preferred to be at least 500 Å thicker than the mesa 112 above the substrate 100, so when the mesa 112 is about 1,000 Å thick, the dielectric layer should be about 1,500 Å thick, measured from over the dielectric layer 102.

Figure 7:
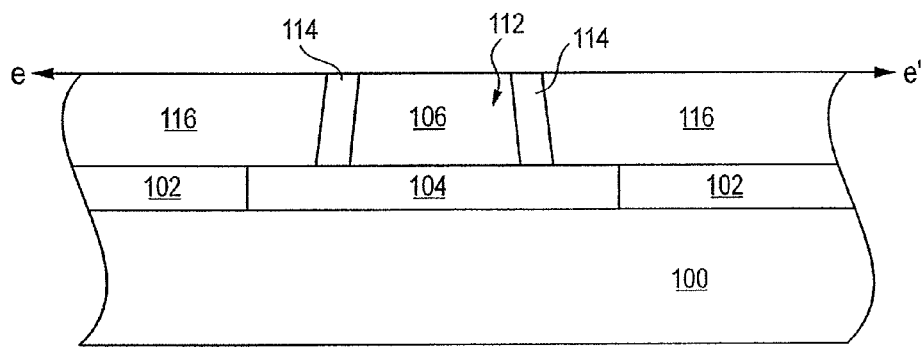

FIG. 7 shows the wafer after an SON CMP (stop on nitride CMP). The dielectric layer 116, hard mask 110, and possibly some of the bottom electrode layer 114 are removed to planarize the wafer, stopping once the mesa 112 material is reached. If the mesa 112 is some material other than a nitride, a different selective CMP can be used to planarize the wafer, but still stopping at the mesa 112. FIG. 8 shows the wafer of FIG. 7 from above (FIG. 7 shows the wafer through cross section e-e' of FIG. 8). As shown in FIG. 8, the planarization by CMP leaves the bottom electrode layer 114 as a ring-shaped structure surrounding the mesa 112 (dielectric material 106) and the electrode layer 114 is surrounded by the dielectric layer 116. FIG. 8 shows the ring-shaped bottom electrode layer 114 and mesa 112 being substantially round in shape, however, such is not necessary and any shape can be used.

FIG. 9 shows the formation of a completed memory cell 122, as discussed above. A memory element 118 is formed over the bottom electrode layer 114 and mesa 112. If the memory cell 122 is to be a phase-change memory, a chalcogenide based material, such as, for example, $Ge_xSb_yTe_z$ or $Ag_aIn_bSb_cTe_d$, is deposited as a layer over the wafer and physically defined to form memory element 118. The memory element 118 layer can be deposited by sputtering, evaporation, or other techniques. Over the memory element 118 layer, a top electrode layer 120 is deposited. The top electrode layer 120 is a conductive material, but is not limited to any specific material; it can be titanium nitride, polysilicon, tungsten, TiW, gold, or aluminum, for example. The memory element 118 layer and top electrode layer 120 can be blanket deposited, patterned and etched together to leave a stack structure over the bottom electrode layer 114 and mesa 112. The memory element 118 is in contact with the bottom electrode layer 114 at the electrode's surface area 114a. An insulating and protective dielectric layer 124 can then be formed over the memory cell 122.

Figure 10:
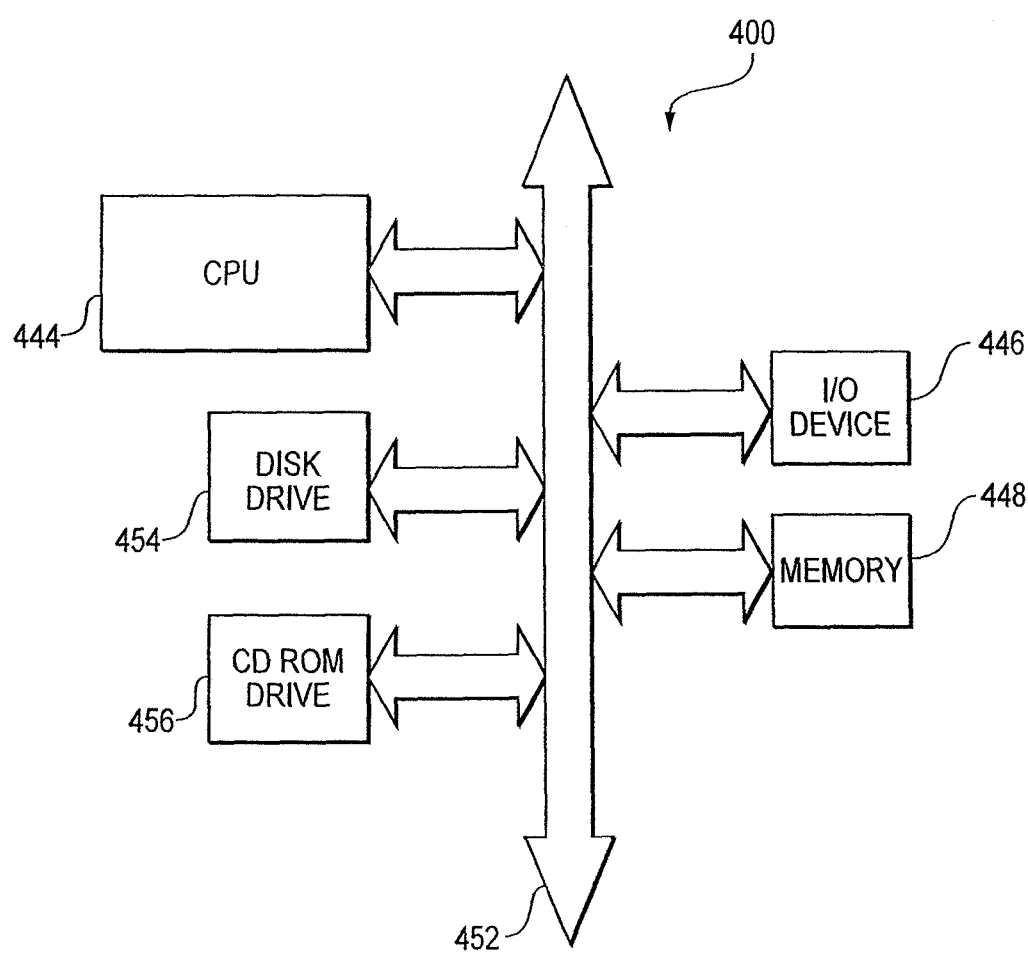
FIG. 10 shows a processor system incorporating at least one contact constructed in accordance with an embodiment of the invention.

FIG. 10 illustrates a simplified processor system 400 which includes a memory circuit 448, e.g., a phase-change memory device, which employs resistance variable memory devices (e.g., memory cell 122) fabricated in accordance with the invention, having ring-shaped electrode contacts 114 (FIG. 7-9). A processor system, such as a computer system, generally comprises a central processing unit (CPU) 444, such as a microprocessor, a digital signal processor, or other programmable digital logic devices, which communicates with an input/output (I/O) device 446 over one or more bus and/or bridge structures 452. The memory circuit 448 communicates with the CPU 444 over bus/bridge 452 typically through a memory controller.

In the case of a computer system, the processor system may include peripheral devices such as a hard disk drive 454 and a compact disc (CD) ROM drive 456, which also communicate with CPU 444 over the bus 452. Memory circuit 448 is preferably constructed as an integrated circuit, which includes one or more resistance variable memory devices, e.g., device 122. If desired, the memory circuit 448 may be combined with the processor, for example CPU 444, in a single integrated circuit.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the spirit and scope of the invention as defined in the appended claims.

What is claimed as new and desired to be protected by Letters Patent of the United States is:

1. A method of forming a contact for an integrated circuit, comprising:
    forming a first dielectric layer over a substrate;
    forming a hard mask layer of the first dielectric layer;
    removing a portion of the first dielectric layer and the hard mask layer to form a mesa structure over the substrate, said mesa structure having at least one sidewall and comprising unremoved portions of the first dielectric layer and said hard mask layer that remain over the substrate;
    forming a conductive layer over said mesa structure and said substrate; and
    removing said conductive layer from top surfaces of said mesa structure and said substrate to leave said conductive layer at least partially surrounding said mesa structure on said sidewall.

2. The method of claim 1, further comprising:
    forming a second dielectric layer over said mesa structure, said conductive layer, and said substrate; and
    planarizing said second dielectric layer to expose said conductive layer and remove said hard mask layer, using said unremoved portion of the first dielectric layer as a stop.

3. The method of claim 1, wherein the step of removing a portion of a first dielectric layer and a hard mask layer comprises an etching step.

4. The method of claim 1, wherein one of said hard mask and said first dielectric layer comprises an oxide and the other comprises a nitride.

5. The method of claim 1, wherein said conductive layer is removed using a dry etch.

6. The method of claim 1, wherein after said removing of said conductive layer, the remaining conductive layer surrounds said mesa structure at a sidewall thereof.

7. The method of claim 1, wherein said mesa structure is formed to be substantially circular in shape.

8. The method of claim 1, further comprising forming a memory cell over said contact.

9. The method of claim 8, further comprising forming a phase-change memory element over said contact and an electrode layer over said phase-change memory element.

10. The method of claim 1, wherein said first dielectric layer comprises a material selected from the group consisting of silicon nitride, tantalum oxide, aluminum oxide, titanium dioxide, magnesium oxide, silicon carbide, zirconia, and strontium titanate.

11. The method of claim 1, wherein said conductive layer comprises at least one of titanium nitride, titanium aluminum nitride, and tantalum nitride.

* * * * *